(12) United States Patent
Ji

(10) Patent No.: US 10,901,314 B2
(45) Date of Patent: Jan. 26, 2021

(54) PIXEL ARRANGEMENT STRUCTURE, ORGANIC LIGHT EMITTING DEVICE, DISPLAY DEVICE AND MASK

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Fengli Ji, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 45 days.

(21) Appl. No.: 15/744,944

(22) PCT Filed: Jun. 27, 2017

(86) PCT No.: PCT/CN2017/090276
§ 371 (c)(1),
(2) Date: Jan. 15, 2018

(87) PCT Pub. No.: WO2018/090630
PCT Pub. Date: May 24, 2018

(65) Prior Publication Data
US 2019/0011830 A1 Jan. 10, 2019

(30) Foreign Application Priority Data

Nov. 16, 2016 (CN) .......................... 2016 1 1009028

(51) Int. Cl.
*H01L 29/20* (2006.01)
*G03F 1/60* (2012.01)
(Continued)

(52) U.S. Cl.
CPC .............. *G03F 1/60* (2013.01); *H01L 27/326* (2013.01); *H01L 27/3213* (2013.01);
(Continued)

(58) Field of Classification Search
CPC ............. H01L 27/3218; H01L 27/3246; H01L 27/326; H01L 51/56; G03F 1/60
(Continued)

(56) References Cited

U.S. PATENT DOCUMENTS

2012/0092237 A1 4/2012 Phan
2014/0071030 A1* 3/2014 Lee ...................... G09G 3/3208
345/82
(Continued)

FOREIGN PATENT DOCUMENTS

CN 101930207 A 12/2010
CN 104332486 A 2/2015
(Continued)

OTHER PUBLICATIONS

Chinese Search Report dated Feb. 27, 2017; Appln. 201611009028.7.
(Continued)

*Primary Examiner* — Brook Kebede

(57) ABSTRACT

A pixel arrangement structure includes a plurality of pixel groups that are periodically arranged. Each pixel group includes four pixels, a first pixel and a second pixel are arranged in a same row, a third pixel and a fourth pixel are arranged in adjacent another row, the first pixel and the third
(Continued)

pixel are arranged in a same column, and the second pixel and the fourth pixel are arranged in adjacent another column. An arrangement of sub-pixels in the first pixel is different from an arrangement of sub-pixels in the second pixel, an arrangement of sub-pixels in the third pixel is same as the arrangement of the sub-pixels in the second pixel, and an arrangement of sub-pixels in the fourth pixel is same as the arrangement of the sub-pixels in the first pixel. An organic light emitting device, a display device and a mask are also provided.

15 Claims, 7 Drawing Sheets

(51) Int. Cl.
   *H01L 27/32* (2006.01)
   *H01L 51/56* (2006.01)
   *F21Y 115/15* (2016.01)

(52) U.S. Cl.
   CPC ...... *H01L 27/3216* (2013.01); *H01L 27/3218* (2013.01); *H01L 27/3246* (2013.01); *H01L 51/56* (2013.01); *F21Y 2115/15* (2016.08)

(58) Field of Classification Search
   USPC .................................. 257/40, 49, 50, 54, 89
   See application file for complete search history.

(56) References Cited

U.S. PATENT DOCUMENTS

| | | | | |
|---|---|---|---|---|
| 2015/0364526 | A1* | 12/2015 | Peng | H01L 27/3218 |
| | | | | 257/40 |
| 2016/0126296 | A1* | 5/2016 | Feng | H01L 27/3218 |
| | | | | 257/40 |
| 2016/0358985 | A1* | 12/2016 | Bai | H01L 27/3218 |

FOREIGN PATENT DOCUMENTS

| | | |
|---|---|---|
| CN | 105023934 A | 11/2015 |
| CN | 105575353 A | 5/2016 |
| CN | 106298865 A | 1/2017 |
| CN | 206163494 U | 5/2017 |

OTHER PUBLICATIONS

The International Search Report and Written Opinion dated Sep. 22, 2017; PCT/CN2017/090276.

The First Chinese Office Action dated May 10, 2017; Appln. No. 201611009028.7.

The Second Chinese Office Action dated Sep. 11, 2017; Appln. No. 201611009028.7.

The Third Chinese Office Action dated Jan. 19, 2018 Appln. No. 201611009028.7.

* cited by examiner

PIXEL ARRANGEMENT STRUCTURE, ORGANIC LIGHT EMITTING DEVICE, DISPLAY DEVICE AND MASK

TECHNICAL FIELD

Embodiments of the present disclosure relate to a pixel arrangement structure, an organic light emitting device, a display device and a mask.

BACKGROUND

In the mobile phone and flat panel display technology, active matrix organic light emitting diode (AMOLED) panels gradually become the mainstream of the next generation display due to the advantages of self-illumination, fresh colors, low power consumption, wide viewing angles and so on.

The self-illumination principle of AMOLED comprises: an indium tin oxide (ITO) semiconductor electrode and a metal electrode that are made on a back plate are respectively used as the anode and the cathode of the device, and the organic semiconductor material and the light-emitting material are deposited on the substrate. Driven by a certain voltage, electrons and holes are respectively injected from the cathode and the anode into the electron transport layer and the hole transport layer, and the electrons and holes respectively migrate to the light emitting layer through the electron transport layer and the hole transport layer and combine in the light emitting layer to form excitons and excite the light-emitting molecules to emit visible light through radiant relaxation.

At present, the requirements on the resolution and brightness of mobile phones or flat panels increasingly become high, but the production of organic light emitting diode (OLED) displays with high quality and high resolution still faces many challenges. As for AMOLEDs with high resolution, one technology that restricts their development is fine metal mask (FMM), and the manufacture of the metal mask for vapor deposition is more and more difficult with the resolution being increased. At the same time, due to the increase of the resolution, the distance between the emitting areas of sub-pixels is demanded to be smaller and smaller, and the color mixing phenomenon of the screen that is made through vapor deposition is more and more serious. Especially for the three sub-pixels for red (R), green (G), and blue (B) that are in the traditional stripe arrangement, the length of the opening area of the FMM corresponding to each sub-pixel is long, the linearity is difficult to be controlled and the color mixing is easily caused. Although the traditional slot RGB arrangement does not lead to a long opening and an unmanageable linearity, in the manufacture process of the opening area of the FMM, a certain metal material must be reserved between the opening areas of each Slot as a connecting bridge (called as Rib), resulting in a reduced opening area of the sub-pixel FMM, thus affecting the aperture ratio of the OLED display device. With a low aperture ratio, brightness and service life cannot meet the requirements. As a result, the yield of AMOLED products is low, limiting the mass production of AMOLED panels with high resolution.

SUMMARY

An embodiment of the present disclosure provides a pixel arrangement structure. The pixel arrangement structure comprises a plurality of pixel groups that are periodically arranged, and each pixel group comprises four pixels, wherein a first pixel and a second pixel are arranged in a same row, a third pixel and a fourth pixel are arranged in adjacent another row, the first pixel and the third pixel are arranged in a same column, and the second pixel and the fourth pixel are arranged in adjacent another column; an arrangement of sub-pixels in the first pixel is different from an arrangement of sub-pixels in the second pixel, an arrangement of sub-pixels in the third pixel is same as the arrangement of the sub-pixels in the second pixel, and an arrangement of sub-pixels in the fourth pixel is same as the arrangement of the sub-pixels in the first pixel.

That is, in the pixel arrangement structure that is provided in the embodiment of the present disclosure, in the pixel groups that are periodically arranged, each pixel group comprises four pixels, wherein the first pixel and the second pixel are arranged in same row, the third pixel and the fourth pixel are arranged in the adjacent another row, the first pixel and the third pixel are arranged in same column, and the second pixel and the fourth pixel are arranged in the adjacent another column; the arrangement of the sub-pixels in the first pixel is different from the arrangement of the sub-pixels in the second pixel, the arrangement of the sub-pixels in the third pixel is same as the arrangement of the sub-pixels in the second pixel, and the arrangement of the sub-pixels in the fourth pixel is same as the arrangement of the sub-pixels in the first pixel, that is, in the plurality of pixel groups that are periodically arranged, the arrangements of sub-pixels in two pixels in a diagonal position relationship are same, but the arrangements of sub-pixels in two pixels that are adjacent in the row direction are different, and the arrangements of sub-pixels in two pixels that are adjacent in the column direction are also different. In this way, the staggered arrangement of the sub-pixels in different pixels that are adjacent in the row direction or in the column direction is realized, which allows the opening area of the metal mask for manufacturing the pixel arrangement structure to be larger, the aperture ratio to be increased, and the light emitting area to be increased. Therefore, the brightness, service life and image definition of the AMOLED product are improved.

For example, each of the pixels comprises sub-pixels in three colors.

For example, a first color sub-pixel, a second color sub-pixel and a third color sub-pixel in the first pixel are arranged in a normal triangle, and a first color sub-pixel, a second color sub-pixel and a third color sub-pixel in the second pixel are arranged in an inverted triangle.

For example, the first color sub-pixel in the first pixel, and the second color sub-pixel and the third color sub-pixel in the second pixel are arranged in a straight line; the second color sub-pixel and the third color sub-pixel in the first pixel, and the first color sub-pixel in the second pixel are arranged in a straight line.

For example, the sub-pixels in three colors in each of the pixels comprise a red sub-pixel, a green sub-pixel and a blue sub-pixel; an area that is occupied by the blue sub-pixel is larger than an area that is occupied by the green sub-pixel, and the area that is occupied by the green sub-pixel is larger than an area that is occupied by the red sub-pixel.

For example, colors of sub-pixels that are adjacent to each other respectively in the first pixel and in the third pixel in a column direction are same, and colors of sub-pixels that are adjacent to each other respectively in the second pixel and in the fourth pixel in the column direction are same.

Therefore, in the embodiments of the present disclosure, the sub-pixels can be manufactured in a "two in one"

manner. That is, the two sub-pixels in a same color that are adjacent in the column direction can be manufactured in one opening area, thus improving the aperture ratio of the product and meeting the requirement of a high PPI Real RGB arrangement.

For example, distances between any one of the sub-pixels and adjacent sub-pixels in different colors are same.

For example, at least one sub-pixel in each of the pixels is in a shape of polygon with more than four sides.

For example, each of the sub-pixels is in a shape of pentagon.

These sub-pixels are in the shapes of polygon having more than four sides, such as pentagon or hexagon, and are arranged in a staggered manner, enabling the light emitting area to be larger and the light emitting area to be effectively utilized.

For example, opposite sides of any two adjacent sub-pixels are parallel to each other.

An embodiment of the present disclosure provides an organic light emitting device, the organic light emitting device comprises a base substrate and the above pixel arrangement structure that is arranged on the base substrate.

An embodiment of the present disclosure provides a display device, the display device comprises the above organic light emitting device.

An embodiment of the present disclosure provides a mask adaptive for manufacturing the above pixel arrangement structure, the mask comprises a substrate and opening areas that are arranged on the substrate corresponding to the sub-pixels in the pixel arrangement structure.

For example, each opening area corresponds to sub-pixels that are adjacent to each other in a column direction and in a same color one by one.

For example, each opening area is in a shape of hexagon.

The pixel arrangement structure, the organic light emitting device, the display device and the mask provided by the embodiments of the present disclosure allow the opening area of the metal mask adaptive for manufacturing the pixel arrangement structure to be larger, so as to improve the aperture ratio and improve the brightness, service life and image definition of the AMOLED product.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure, other drawings can also be obtained for those skilled in the art according to the accompanying drawings without creative efforts.

DETAILED DESCRIPTION

Figure 1:
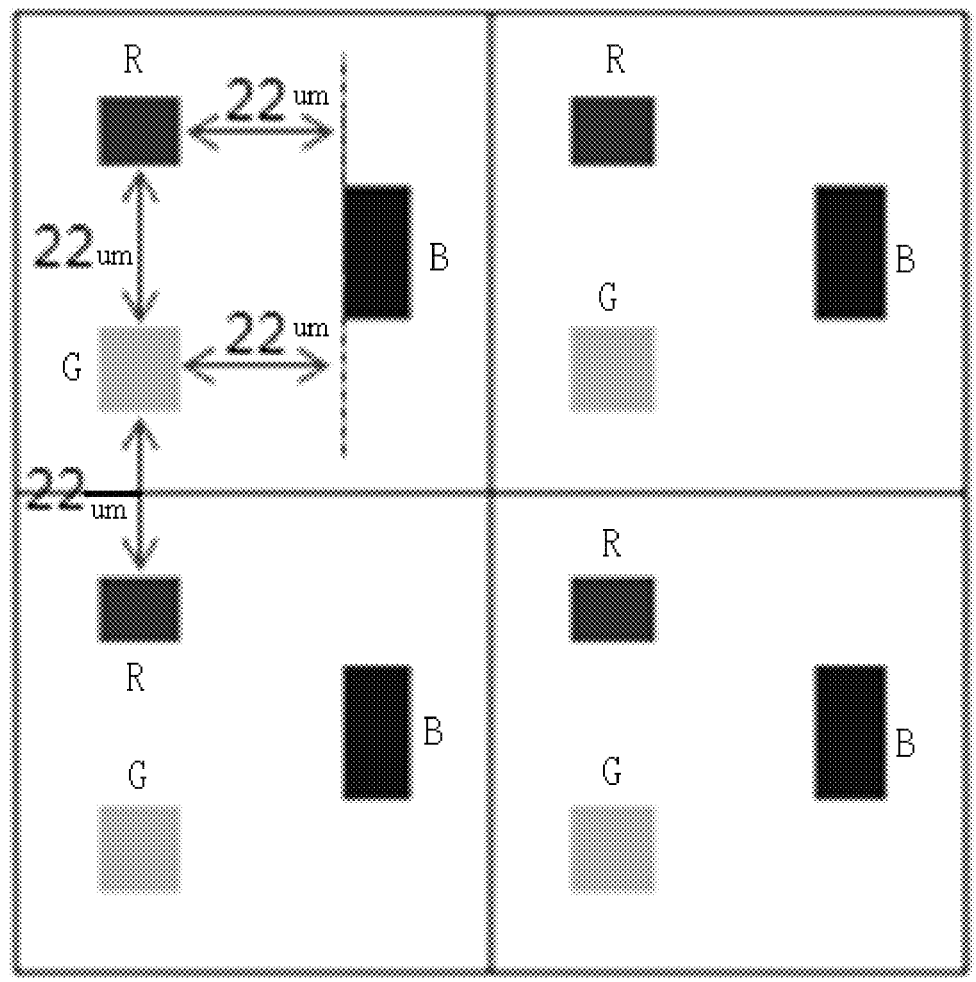
FIG. 1 is a schematic diagram of a pixel arrangement structure.
Figure 2:
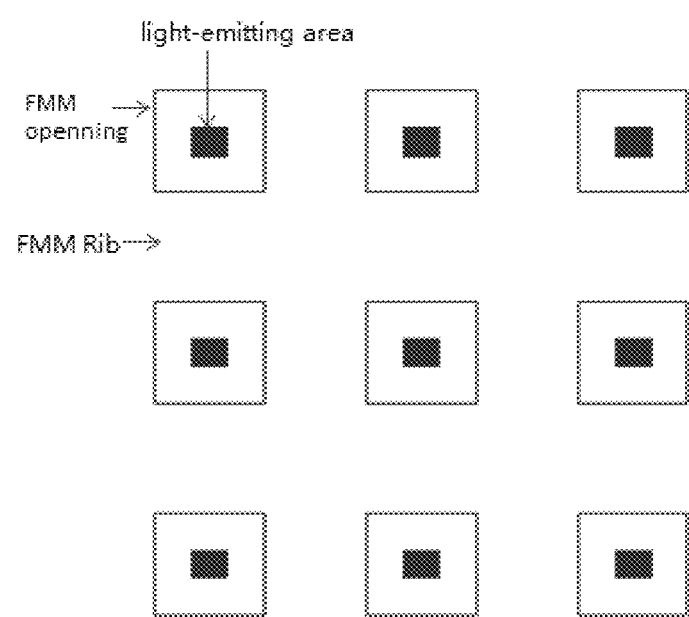
FIG. 2 is a schematic diagram of a FFM opening of a pixel arrangement.

A pixel arrangement structure is described below based on FIG. 1 and FIG. 2. Referring to FIG. 1, the pixel arrangement structure adopts a slot arrangement, each pixel comprises three sub-pixels, namely R sub-pixel, G sub-pixel and B sub-pixel, and a fine metal mask (FMM) corresponding to each sub-pixel in one color is illustrated in FIG. 2. There is a light emitting area in each opening of the FMM, and the distance between each sub-pixel and the adjacent sub-pixel in a different color is called a PDL gap. When the PDL Gap is certain, as illustrated in FIG. 1, the distance is 22 µm, the size of the pixel is 63.3 µm, the light emitting area of the R sub-pixel is 90.1 µm², the light emitting area of the G sub-pixel is 114.48 µm², the light emitting area of the B sub-pixel is 150.51 µm², the aperture ratio of R, G and B sub-pixels are 2.25%, 2.86% and 3.76%, respectively, and the total aperture ratio is 8.87%. The aperture ratio is low, and the service life of the product is short.

The above pixel arrangement structure can lead to a relatively small opening area of the metal mask, and therefore result in a relatively small light emitting area, a low aperture ratio, an inadequate brightness of the product, and a short service life, so that the yield of the AMOLED product is low, limiting the quantity production of the AMOLED panel with high resolution to a certain degree.

The following embodiments of the present disclosure provide a pixel arrangement structure, an organic light emitting device, a display device and a mask to allow the opening area of a metal mask for manufacturing the pixel arrangement structure to be larger. Therefore, the aperture ratio, the brightness, service life and image definition of an AMOLED product are improved.

The technical solutions provided in the embodiments of the present disclosure comprise a Real RGB pixel arrangement structure that is used for a high-resolution OLED display and a vapor deposition fine metal mask design thereof.

Figure 3:
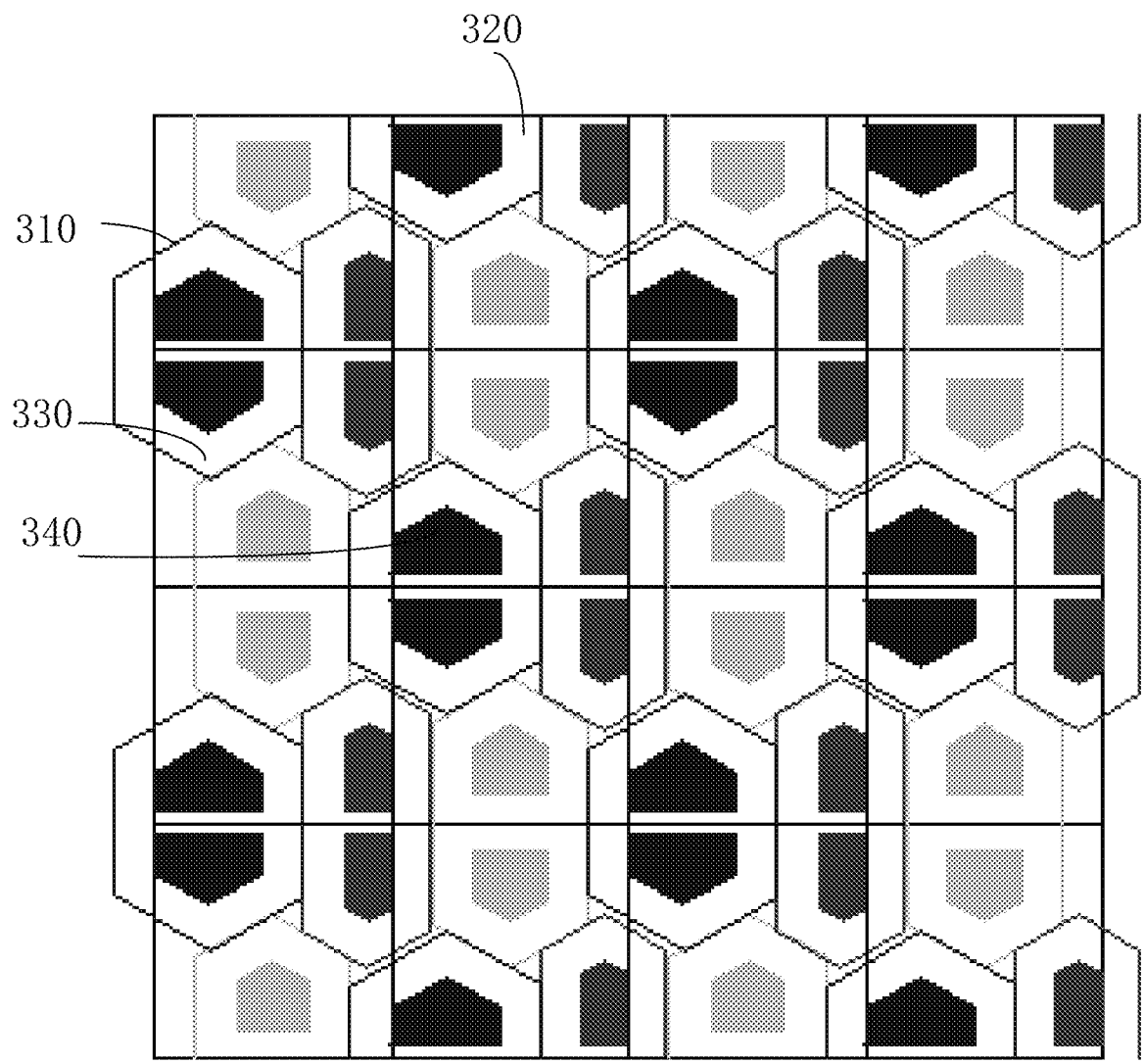
FIG. 3 is a schematic diagram of a pixel arrangement structure provided by an embodiment of the present disclosure.
Figure 4:
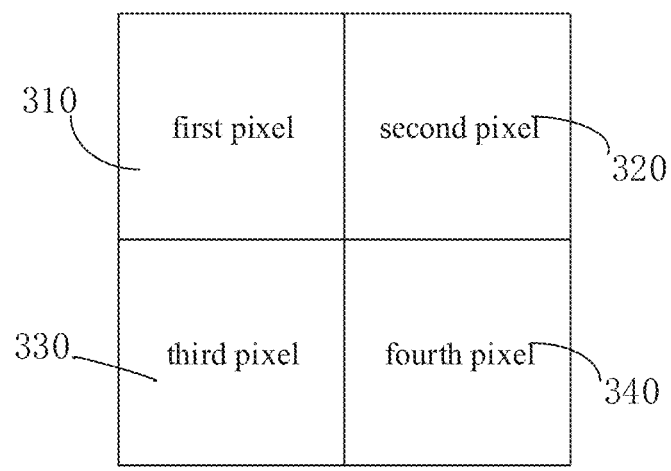
FIG. 4 is a structure schematic diagram of a pixel group provided by an embodiment of the present disclosure.

Referring to FIG. 3, the embodiment of the present disclosure provides a pixel arrangement structure. The pixel arrangement structure comprises a plurality of pixel groups that are periodically arranged, and each pixel group comprises four pixels, referring to FIG. 4, wherein a first pixel 310 and a second pixel 320 are arranged in a same row, a third pixel 330 and a fourth pixel 340 are arranged in adjacent another row, the first pixel 310 and the third pixel 330 are arranged in a same column, and the second pixel 320 and the fourth pixel 340 are arranged in adjacent another column. Combined with the structure of the pixel groups illustrated in FIG. 4 and the pixel group comprising four pixels in the upper left corner of FIG. 3, it can be seen that an arrangement of sub-pixels in the first pixel 310 is different from an arrangement of sub-pixels in the second pixel 320, an arrangement of sub-pixels in the third pixel 330 is same as the arrangement of the sub-pixels in the second pixel 320, and an arrangement of sub-pixels in the fourth pixel 340 is same as the arrangement of the sub-pixels in the first pixel 310.

That is, in the pixel arrangement structure provided in the embodiment of the present disclosure, in the pixel groups that are periodically arranged, each pixel group comprises four pixels, the first pixel and the second pixel are arranged in same row, and the third pixel and the fourth pixel are arranged in the adjacent another row; the first pixel and the third pixel are arranged in same column, and the second pixel and the fourth pixel are arranged in the adjacent another column. The arrangement of the sub-pixels in the first pixel, is different from the arrangement of the sub-pixels in the second pixel, the arrangement of the sub-pixels in the third pixel is same as the arrangement of the sub-pixels in the second pixel, and the arrangement of the sub-pixels in the fourth pixel is same as the arrangement of the sub-pixels in the first pixel. That is, in the plurality of pixel groups that are periodically arranged, the arrangements of sub-pixels in two pixels in a diagonal position relationship are same, but the arrangements of sub-pixels in two pixels that are adjacent in the row direction are different, and the arrangements of sub-pixels in two pixels that are adjacent in the column direction are also different. In this way, the staggered arrangement of the sub-pixels in different pixels that are adjacent in the row direction or in the column direction is realized, which allows the opening area of the metal mask for manufacturing the pixel arrangement structure to be larger, the aperture ratio to be increased, and the light emitting area to be increased. Therefore, the brightness, service life and image definition of the AMOLED product are improved.

It should be noted that in the embodiment of the present disclosure, each of the pixels comprises sub-pixels in three colors, but the technical solutions provided in the embodiment of the present disclosure are not limited to this case, and each of the pixels can also comprise sub-pixels in four colors and so on.

Optionally, a first color sub-pixel, a second color sub-pixel and a third color sub-pixel in the first pixel are arranged in a normal triangle, and a first color sub-pixel, a second color sub-pixel and a third color sub-pixel in the second pixel are arranged in an inverted triangle.

Figure 5:
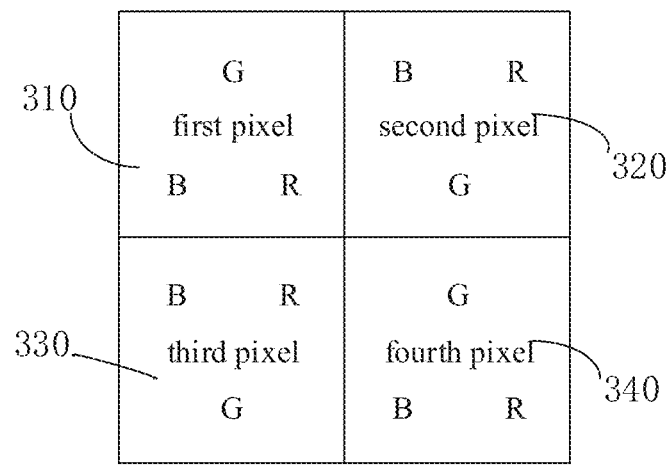
FIG. 5 is a schematic diagram of an arrangement structure of sub-pixels in a pixel group provided by an embodiment of the present disclosure.

For example, the first color sub-pixel is a G sub-pixel, the second color sub-pixel is a B sub-pixel and the third color sub-pixel is an R sub-pixel. Referring to FIG. 5, the arrangement of the R, G, and B sub-pixels in the first pixel 310 is in a normal triangle, and the arrangement of the R, G and B sub-pixels in the second pixel 320 is in an inverted triangle. The arrangement of the R, G, and B sub-pixels in the first pixel 310 is same as the arrangement of the R, G, and B sub-pixels in the fourth pixel 340, and the arrangement of the R, G, and B sub-pixels in the second pixel 320 is same as the arrangement of the R, G and B sub-pixels in the third pixel.

Optionally, the first color sub-pixel in the first pixel, and the second color sub-pixel and the third color sub-pixel in the second pixel are arranged in a straight line; the second color sub-pixel and the third color sub-pixel in the first pixel, and the first color sub-pixel in the second pixel are arranged in a straight line.

For example, referring to FIG. 5, the G sub-pixel in the first pixel 310 and the B sub-pixel, R sub-pixel in the second pixel 320 are arranged in a straight line; the B sub-pixel, R sub-pixel in the first pixel 310 and the G sub-pixel in the second pixel 320 are arranged in a straight line. Similarly, the G sub-pixel in the fourth pixel 340 and the B sub-pixel, R sub-pixel in the third pixel 330 are arranged in a straight line; the B sub-pixel, R sub-pixel in the fourth pixel 340 and the G sub-pixel in the third pixel 330 are arranged in a straight line.

Figure 6:
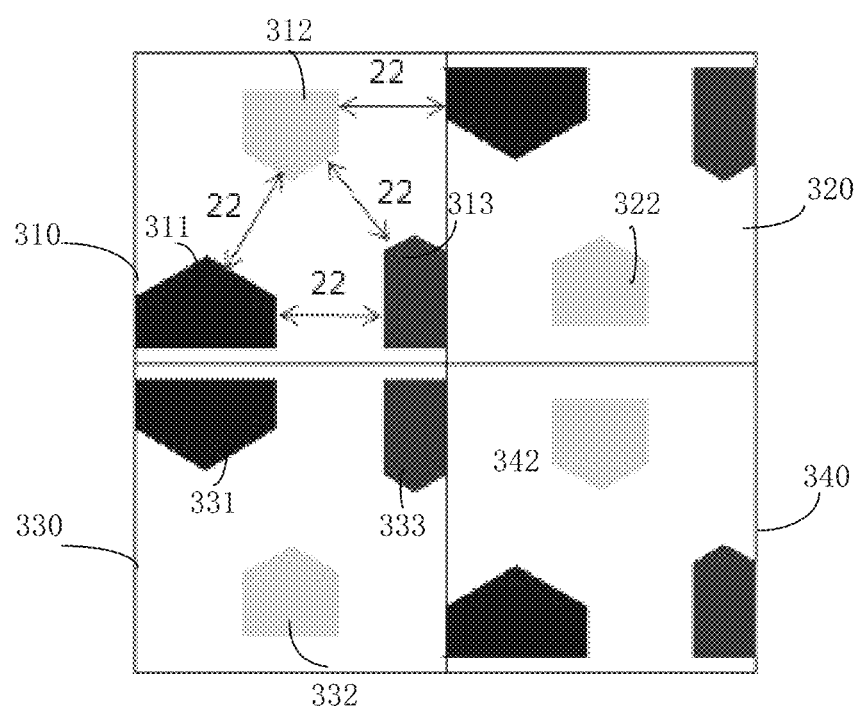
FIG. 6 is a schematic diagram of a light emitting area of a pixel arrangement provided by a pixel group in an embodiment of the present disclosure.

Optionally, referring to FIG. 6, the sub-pixels in three colors in each of the pixels comprise a red sub-pixel, a green sub-pixel and a blue sub-pixel, wherein an area that is occupied by the blue sub-pixel 311 is larger than an area that is occupied by the green sub-pixel 312, and the area that is occupied by the green sub-pixel 312 is larger than an area that is occupied by the red sub-pixel 313. Namely, the area of the B sub-pixel is larger than the area of the G sub-pixel and the area of the G sub-pixel is larger than the area of the R sub-pixel. The relative positions of the sub-pixels in a same pixel that are illustrated in FIG. 5 and FIG. 6 are same.

Optionally, referring to FIG. 6, colors of sub-pixels that are adjacent to each other respectively in the first pixel 310 and in the third pixel 330 in a column direction are same, and colors of sub-pixels that are adjacent to each other respectively in the second pixel 320 and in the fourth pixel 340 in the column direction are same. That is, the B sub-pixel 311 in the first pixel 310 and the B sub-pixel 331 in the third pixel 330 are adjacent to each other and are axisymmetrically arranged, the R sub-pixel 313 in the first pixel 310 and the R sub-pixel 333 in the third pixel 330 are adjacent to each other and are axisymmetrically arranged, and the G sub-pixel 322 in the second pixel 320 and the G sub-pixel 342 in the fourth pixel 340 are adjacent to each other and are axisymmetrically arranged.

Therefore, in the embodiments of the present disclosure, the sub-pixels can be manufactured in a "two in one" manner. That is, referring to FIG. 7, the two sub-pixels in a same color that are adjacent to each other in the column direction can be manufactured in one opening area, thus improving the aperture ratio of the product and meeting the requirement of high PPI Real RGB arrangement.

Optionally, distances between any one of the sub-pixels and adjacent sub-pixels in different colors are same. For example, referring to FIG. 6, distances between any one of the sub-pixels and adjacent sub-pixels in different colors are all 22 μm. Taking the G sub-pixel in the first pixel as an example, the distance between the opposite sides of the G sub-pixel and the adjacent B sub-pixel in a same pixel is 22 μm, and the distance between the opposite sides of the G sub-pixel and the R sub-pixel in the same pixel is 22 um, the distance between the opposite sides of the G sub-pixel and the adjacent B sub-pixel in the second pixel is also 22 um, and the distance between the opposite sides of the B sub-pixel and the R sub-pixel in the same pixel is 22 um.

Optionally, at least one sub-pixel in each of the pixels is in a shape of polygon with more than four sides.

Optionally, each of the sub-pixels is in a shape of pentagon, and obviously, it also can be in a shape of hexagon and so on.

These sub-pixels are in the shapes of polygon having more than four sides, such as pentagon or hexagon, and are arranged in a staggered manner, allowing the light emitting area to be larger and the light emitting area to be effectively utilized.

Optionally, opposite sides of any two adjacent sub-pixels are parallel to each other.

In conclusion, the pixel arrangement in the embodiment of the present disclosure is illustrated in FIG. 6. Three different sub-pixels in each pixel are sequentially arranged to form a triangle, and the arrangement patterns of sub-pixels in two left and right adjacent pixels are arranged in a staggered manner. The first pixel that is arranged in the first column and in the first row comprises three sub-pixels: R sub-pixel, G sub-pixel, and B sub-pixel, respectively, wherein the light emitting area of the R sub-pixel and the light emitting area of the B sub-pixel are at lower positions in the pixels of the first row, the light emitting area of the G sub-pixel is at an upper position in the pixels of the first row, and therefore a shape of "normal triangle" is formed. The second pixel that is arranged in the first row and in the second column also comprises three sub-pixels: R sub-pixel, G sub-pixel, and B sub-pixel, respectively, wherein the light emitting area of the R sub-pixel and the light emitting area of the B sub-pixel are at upper positions in the pixels of the first row, the light emitting area of the G sub-pixel is at a lower position in the pixels of the first row, and therefore a shape of "inverted triangle" is formed. Namely the light emitting area of the first pixel and the light emitting area of the second pixel respectively form a shape of "normal triangle" and a shape of "inverted triangle". Similarly, the light emitting area of the third pixel and the light emitting area of the fourth pixel respectively form a shape of "inverted triangle" and a shape of "normal triangle". Therefore the two shapes of "normal triangle" and the two shapes of "inverted triangle" form a pixel group in a shape of square, which is used as the basic periodical unit of the pixel arrangement structure.

Figure 7:
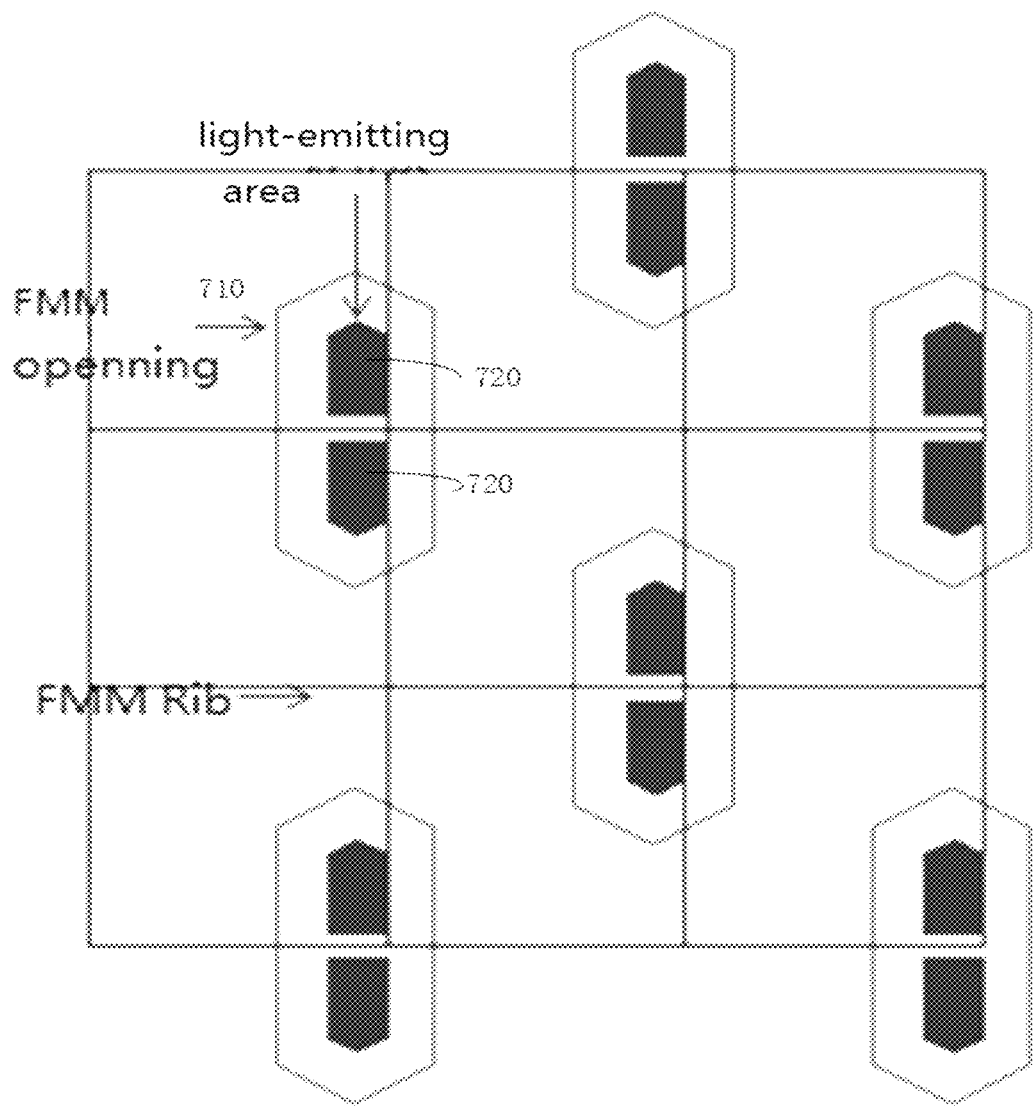
FIG. 7 is a schematic diagram of an FFM opening area corresponding to an arrangement of the sub-pixels in one color provided by an embodiment of the present disclosure.
Figure 8:
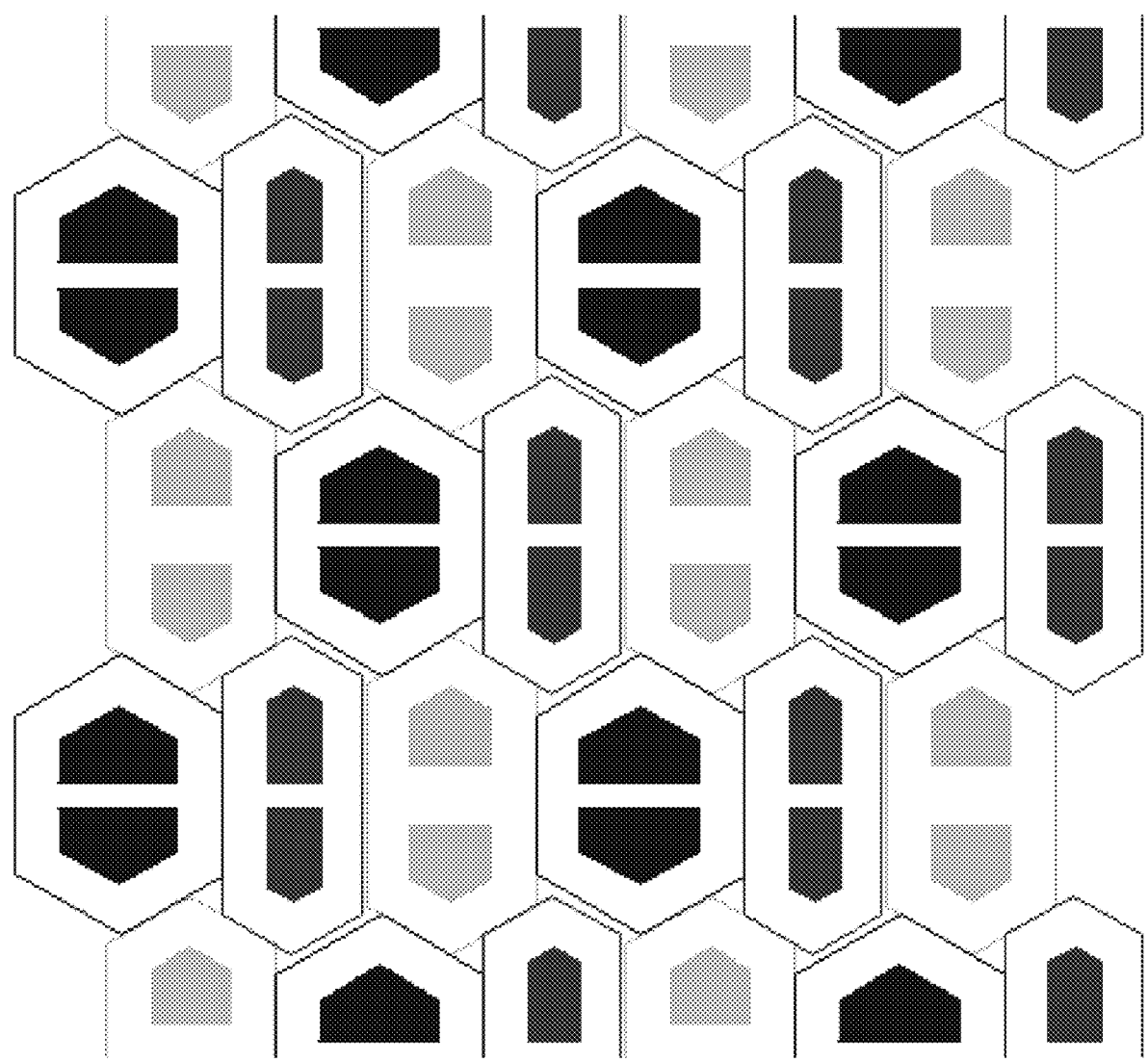
FIG. 8 is a schematic diagram of an FFM opening area of a light emitting area in a pixel arrangement provided by an embodiment of the present disclosure.

In the embodiment of the present disclosure, the emitting areas of each of the R, G, and B sub-pixels are in pixels of one row, and pixels of each row comprise R, G and B sub-pixels respectively in two rows: an upper row and a lower row, and each of the sub-pixels is in a shape of pentagon. Referring to FIG. 7, by arranging the sub-pixels in the upper row and the lower row in a staggered manner, the aperture ratio is increased and the service life of the light emitting material is lengthened. In addition, the sub-pixels that are respectively in two adjacent rows of pixels and also adjacent to each other are in a same color, so that these sub-pixels in a same color can share one FMM opening, that is, as illustrated in FIG. 7, one FMM opening comprises two light emitting areas, and this FMM design is called as a "two in one" manner for short. For each color of R, G and B, two sub-pixels are contained in one FMM opening, and the "two in one" manner is adopted, that is, every two sub-pixels in a same color are manufactured by one opening area, and the shapes of the two sub-pixels are axisymmetric, the same pixel sizes thereof are 63.3 um. In a case that the PDL gap is certain, for example, is 22 μm, the light emitting area of the R pixel is 266.5 μm², the light emitting area of the G pixel is 306.5 μm², and the light emitting area of the B pixel is 411.5 μm². The aperture ratios of R, G and B sub-pixels are 6.65%, 7.65% and 10.27%, respectively, and the total aperture ratio is 24.57%, thus greatly improving the aperture ratio, and meeting the requirement of the service life of the product. Compared with the conventional FMM, the aperture ratio of the sub-pixels corresponding to the hexagon FMM in the "two in one" manner provided by the embodiment of the present disclosure is obviously increased, as illustrated in FIG. 8, which obviously increases the service life of the RGB light emitting diode and makes sense for the AMOLED product.

An embodiment of the present disclosure further provides an organic light emitting device, the organic light emitting device comprises a base substrate and the above pixel arrangement structure that is arranged on the base substrate.

An embodiment of the present disclosure further provides a display device, and the display device comprises the above organic light emitting device.

An embodiment of the present disclosure further provides a mask adaptive for manufacturing the above pixel arrangement structure. The mask comprises a substrate and opening areas that are arranged on the substrate corresponding to the sub-pixels in the pixel arrangement structure, as illustrated in FIG. 8 for example.

Optionally, each opening area corresponds in a one-to-one manner to sub-pixels that are adjacent to each other in a column direction and in a same color.

Optionally, each opening area is in a shape of hexagon.

In this embodiment of the present disclosure, in each pixel group, colors of sub-pixels that are adjacent to each other respectively in the first pixel and in the third pixel in the column direction are same, and colors of sub-pixels that are adjacent to each other respectively in the second pixel and in the fourth pixel in the column direction are same. This arrangement benefits the manufacture of fine metal mask, namely, a "two in one" manner can be used to improve the aperture ratio of the product, and meet the requirement of the high PPI Real RGB arrangement. The two sub-pixels in a same color that are adjacent to each other in the upper and the lower row share a same FMM opening 710, as illustrated in FIG. 7, and the red sub-pixel is taken as an example to adopt the "two in one" manner. The distance between the two light emitting areas 720 in the same FMM opening 710 is not limited by the fine metal mask (FMM), and in a case that the PDL GAP value is certain, the aperture ratio of the pixel is much larger compared to the conventional design. The area is utilized effectively, so that the light emitting area becomes larger, and the area that does not emit light becomes smaller. The aperture ratio is increased, and the service life is prolonged, which therefore satisfies the requirements of both high PPI and Real RGB, allows the service life of the product to be longer, satisfies the requirement of the high PPI Rear RGB arrangement, and improves the display effect of the product.

The arrangement of pixels plays a crucial role in the manufacture of the metal mask. Compared with the conventional slot-shaped openings, as for the pixel arrangement structure in the embodiment of the present disclosure, the aperture ratio is greatly increased. Compared with the diamond-shaped openings, the RGB openings of the vapor deposition metal mask in the embodiment of the disclosure are larger, which therefore greatly reduces the manufacture difficulty of the mask. In addition, the distance between the openings is large, which can effectively prevent the mask from deforming during the opening process so as to improve the deposition effect and make the image clearer.

In conclusion, in order to solve the problem that the pixel arrangement restricts the manufacture of the metal mask and the color mixing problem of the screen, and also in order to increase the aperture ratio and the service life of the AMOLED device, the embodiments of the present disclosure provide a real RGB pixel arrangement structure that benefits the manufacture of the vapor deposition metal mask. In the pixel arrangement structure provided by the embodiment of the present disclosure, in the pixel groups that are periodically arranged, each pixel group comprises four pixels, wherein the first pixel and the second pixel are arranged in same row, and the third pixel and the fourth pixel are arranged in the adjacent another row; the first pixel and the third pixel are arranged in a same column, and the second pixel and the fourth pixel are arranged in the adjacent another column; the arrangement of the sub-pixels in the first pixel is different from the arrangement of the sub-pixels in the second pixel, the arrangement of the sub-pixels in the third pixel is the same as the arrangement of the sub-pixels in the second pixel, and the arrangement of the sub-pixels in the fourth pixel is the same as the arrangement of the sub-pixels in the first pixel. That is, in the plurality of pixel groups that are periodically arranged, the arrangements of sub-pixels in two pixels in a diagonal position relationship are same, but the arrangements of sub-pixels in two pixels that are adjacent in the row direction are different, and the arrangements of sub-pixels in two pixels that are adjacent in the column direction are also different. In this way, the staggered arrangement of the sub-pixels in different pixels that are adjacent in the row direction or in the column direction is realized, which allows the opening area of the metal mask for manufacturing the pixel arrangement structure to be larger, the aperture ratio to be increased, the light emitting area be increased. Therefore, the brightness, service life and image definition of the AMOLED product are improved.

Unless otherwise defined, all the technical and scientific terms used herein have same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

Obviously, those skilled in the art can make various modifications and variations to the present disclosure without departing from the spirit and scope of the disclosure. In this way, if these modifications and variations of the disclosure fall within the scope of the claims and the equivalent features of the disclosure, the disclosure is also intended to comprise these modifications and variations.

The present application claims priority to the Chinese patent application No. 201611009028.7, filed on Nov. 16, 2016, the entire disclosure of which is incorporated herein by reference as part of the present application.

What is claimed is:

1. A pixel arrangement structure, comprising a plurality of pixel groups that are periodically arranged, each pixel group comprising four pixels,
   wherein a first pixel and a second pixel are arranged in a same row, a third pixel and a fourth pixel are arranged in adjacent another row, the first pixel and the third pixel are arranged in a same column, and the second pixel and the fourth pixel are arranged in adjacent another column;
   an arrangement of sub-pixels in the first pixel is different from an arrangement of sub-pixels in the second pixel, an arrangement of sub-pixels in the third pixel is same as the arrangement of the sub-pixels in the second pixel, and an arrangement of sub-pixels in the fourth pixel is same as the arrangement of the sub-pixels in the first pixel; and
   distances between any one of the sub-pixels and adjacent sub-pixels in different colors are same, and the distances between any one of the sub-pixels and adjacent sub-pixels in different colors are all 22 μm.

2. The pixel arrangement structure according to claim 1, wherein each of the pixels comprises sub-pixels in three colors.

3. The pixel arrangement structure according to claim 2, wherein a first color sub-pixel, a second color sub-pixel and a third color sub-pixel in the first pixel are arranged in a normal triangle, and
   a first color sub-pixel, a second color sub-pixel and a third color sub-pixel in the second pixel are arranged in an inverted triangle.

4. The pixel arrangement structure according to claim 3, wherein the first color sub-pixel in the first pixel, and the second color sub-pixel and the third color sub-pixel in the second pixel are arranged in a straight line; and
   the second color sub-pixel and the third color sub-pixel in the first pixel, and the first color sub-pixel in the second pixel are arranged in another straight line.

5. The pixel arrangement structure according to claim 4, wherein colors of sub-pixels that are adjacent to each other respectively in the first pixel and in the third pixel in a column direction are same, and colors of sub-pixels that are adjacent to each other respectively in the second pixel and in the fourth pixel in the column direction are same.

6. The pixel arrangement structure according to claim 2, wherein the sub-pixels in three colors in each of the pixels comprise a red sub-pixel, a green sub-pixel and a blue sub-pixel;
   an area that is occupied by the blue sub-pixel is larger than an area that is occupied by the green sub-pixel, and the area that is occupied by the green sub-pixel is larger than an area that is occupied by the red sub-pixel.

7. The pixel arrangement structure according to claim 6, wherein colors of sub-pixels that are adjacent to each other respectively in the first pixel and in the third pixel in a column direction are same, and colors of sub-pixels that are adjacent to each other respectively in the second pixel and in the fourth pixel in the column direction are same.

8. The pixel arrangement structure according to claim 1, wherein
   colors of sub-pixels that are adjacent to each other respectively in the first pixel and in the third pixel in a column direction are same, and colors of sub-pixels that are adjacent to each other respectively in the second pixel and in the fourth pixel in the column direction are same.

9. The pixel arrangement structure according to claim 1, wherein at least one sub-pixel in each of the pixels is in a shape of polygon with more than four sides.

10. The pixel arrangement structure according to claim 9, wherein each of the sub-pixels is in a shape of pentagon.

11. The pixel arrangement structure according to claim 10, wherein opposite sides of any two adjacent sub-pixels are parallel to each other.

12. The pixel arrangement structure according to claim 2, wherein colors of sub-pixels that are adjacent to each other respectively in the first pixel and in the third pixel in a column direction are same, and colors of sub-pixels that are adjacent to each other respectively in the second pixel and in the fourth pixel in the column direction are same.

13. The pixel arrangement structure according to claim 3, wherein colors of sub-pixels that are adjacent to each other respectively in the first pixel and in the third pixel in a column direction are same, and colors of sub-pixels that are adjacent to each other respectively in the second pixel and in the fourth pixel in the column direction are same.

14. An organic light emitting device, comprising a base substrate and the pixel arrangement structure according to claim 1 that is arranged on the base substrate.

15. A display device, comprising the organic light emitting device according to claim 14.

* * * * *